United States Patent [19]

Jurisch

[11] Patent Number: 5,710,542
[45] Date of Patent: Jan. 20, 1998

[54] METHOD OF MEASURING THE A.C. CURRENT IN A CONDUCTOR IN AN A.C. POWER TRANSMISSION NETWORK

[75] Inventor: Andreas Jurisch, Berlin, Germany

[73] Assignee: Siemens Aktiengesellschaft, Munich, Germany

[21] Appl. No.: 682,656

[22] PCT Filed: Jan. 18, 1995

[86] PCT No.: PCT/DE95/00098

§ 371 Date: Nov. 12, 1996

§ 102(e) Date: Nov. 12, 1996

[87] PCT Pub. No.: WO95/20765

PCT Pub. Date: Aug. 3, 1995

[30] Foreign Application Priority Data

Jan. 26, 1994 [DE] Germany ............... 44 02 762.1

[51] Int. Cl.$^6$ .................................. G08B 21/00
[52] U.S. Cl. ............... 340/664; 340/646; 324/127; 361/76; 361/94; 364/483; 364/572
[58] Field of Search ................... 340/646, 644, 340/652, 661, 662, 664; 364/483, 572; 324/126, 127, 117; 361/76, 77, 78, 87, 93, 94

[56] References Cited

U.S. PATENT DOCUMENTS

| | | | |
|---|---|---|---|
| 5,115,226 | 5/1992 | Schweitzer, III | 340/664 |
| 5,309,312 | 5/1994 | Wilkerson et al. | 361/79 |
| 5,592,393 | 1/1997 | Yalla | 364/492 |

FOREIGN PATENT DOCUMENTS

| | | |
|---|---|---|
| 0 269 827 | 6/1988 | European Pat. Off. |
| 0 355 293 | 2/1990 | European Pat. Off. |

OTHER PUBLICATIONS

Lemmer et al., "Distanzschutz mit Signalprozessortechnik fur die Hochspannungsebene", Etz, vol. 114 (1993) No. 18, pp. 1122–1127.
Bastard et al., "The Technique of Finite–Pulse–Response Filtering applied to Digital Protection and Control of Medium Voltage Power Systems", IEEE Transactions on Power Delivery, vol. 7, No. 2, Apr. 1992, pp. 620–622.
Weighardt et al., "Im Blickpunkt: Digitale Signalverarbeitung", Elektronik 2, Jan. 23, 1987, pp. 89–96.
AEG—Betriebsanleitung fur Distanzschutz PD511.

*Primary Examiner*—Jeffery Hofsass
*Assistant Examiner*—Ashok Mannava
*Attorney, Agent, or Firm*—Kenyon & Kenyon

[57] ABSTRACT

A method for measuring the current in an AC power transmission network, where a measurement quantity is obtained by means of a current transformer and digital samples are converted. To prevent faulty detection of the current due to a decaying DC component of the current transformer, two initial auxiliary measurement quantities that are normal to one another are formed from the digital samples by means of at least two FIR filters, and together with two additional auxiliary measurement quantities that are normal to each other, are used to produce a measured value corresponding to the amplitude of the current. The additional auxiliary measurement quantities are produced from samples formed from an older measurement quantity obtained earlier by a quarter period of the current to be measured. The differential angle is formed from the two measurement quantities. An output signal is generated from the two measured values in an evaluation device when the measured values exceed preset threshold values.

8 Claims, 4 Drawing Sheets

METHOD OF MEASURING THE A.C. CURRENT IN A CONDUCTOR IN AN A.C. POWER TRANSMISSION NETWORK

FIELD OF THE INVENTION

Method of measuring an AC current in a conductor in an AC power transmission network.

BACKGROUND INFORMATION

It is known (see, for example, "etz" vol. 114 (1993) no. 18, pages 1122–1127) that the current in a conductor of an a.c. power transmission network can be measured by means of a current transformer whose primary winding has current flowing through it in the conductor and whose secondary winding is connected to a device for measuring the current. Such a conventional device may be a measuring device or a protective device such as those conventionally used for detecting and localizing short circuits in a.c. power transmission networks. It is also known that a measurement quantity which is provided by the secondary winding of the current transformer and is proportional to the current can be processed digitally, which presupposes that digital samples are formed from the measurement quantity by means of a sampling device (with an analog-digital converter). These digital samples are then processed further in a digital measuring device or a digital protective device.

SUMMARY OF THE INVENTION

The present invention is based on a method of measuring the a.c. current in a conductor of an a.c. power transmission network where a measurement quantity proportional to the current is obtained by means of a current transformer and digital samples are formed from the measurement quantity by means of a sampling device. An object of the present invention is to provide the ability to differentiate, with regard to a secondary current, whether the current measured is based on a current flowing in the conductor of the a.c. power transmission network in the primary circuit or on a decaying d.c. current component caused by the current transformer when the current in the conductor is interrupted.

The above object is achieved according to the present invention in that two initial auxiliary measurement quantities normal to one another are formed from the samples by means of at least two FIR filters; firstly, in an analyzer, an absolute value signal corresponding to the amplitude of the first measurement quantity and secondly an angle signal whose value depends on the phase difference between the first measurement quantities and older measurement quantities determined by complex division of a vector obtained from the first samples by another vector obtained with the older samples are generated from the two initial auxiliary measurement quantities and two additional auxiliary measurement quantities that are normal to one another and are obtained from older samples formed from an older measurement quantity obtained earlier by a quarter period of the current to be measured; and in an evaluation device an output signal is generated from the absolute value signal and the angle signal if these signals exceed preset threshold values. FIR filters are finite-impulse-response filters described in Elektronik 2, Jan. 23, 1987, pp. 89–96, for example.

Furthermore, the method according to the present invention can also be carried out with auxiliary measurement quantities that are not normal to each other. However, much greater effort is then required to carry out the method.

One of the advantages of the method according to the present invention is that it is possible to ascertain at any time whether a current measured in a secondary circuit is to be attributed to a current through the conductor of the a.c. power transmission network or to the decaying d.c. current component of the current transformer when the current flow in the conductor is actually interrupted.

With the method according to the present invention it is advantageous that if a filtered measurement quantity is formed from the samples in a digital high-pass filter first and if the two auxiliary measurement quantities that are normal to one another are formed from the filtered measurement quantity by means of at least two FIR filters. Forming a filtered measurement quantity has the advantage that the decay due to the current transformer can be limited in time by the high-pass filter; in addition, any offset quantities in the samples can be filtered out with the high-pass filter.

The two additional auxiliary measurement quantities can be formed in different ways with the method according to the present invention. It is advantageous if the two additional auxiliary measurement quantities are formed at the same time as the first auxiliary measurement quantities by sending the older samples to at least two additional FIR filters. Then the two additional auxiliary measurement quantities that are normal to one another are formed from the older samples in these two additional FIR filters by a method similar to that used with the current samples.

In this embodiment of the method according to the present invention, advantageously another filtered measurement quantity is formed from the older samples in another high-pass filter first, and the two additional auxiliary measurement quantities are formed from the additional filtered measurement quantity by means of at least two additional FIR filters.

In another advantageous embodiment of the method according to the present invention, the two additional auxiliary measurement quantities are generated by means of a time-delay element that receives the two first auxiliary measurement quantities at the input and, after a quarter period of the current, supplies the two additional auxiliary measurement quantities at the output because of its delay, which corresponds to a quarter period of the current. In this embodiment of the method according to the present invention, the two additional FIR filters for forming the additional auxiliary measurement quantities can thus be omitted in an advantageous manner, thus advantageously reducing the complexity in carrying out the method.

The total of four auxiliary measurement quantities can be analyzed in different ways in the analyzer in the method according to the present invention. From the standpoint of low complexity, however, it is regarded as advantageous if each of the initial auxiliary measurement quantities is multiplied by each of the other auxiliary measurement quantities in the analyzer, forming four intermediate quantities, and two intermediate quantities formed from different first and second auxiliary measurement quantities are added up in an adder, forming two auxiliary quantities; one auxiliary quantity is checked for its sign and the other auxiliary quantity is tested to determine whether it exceeds a preset threshold value. If both conditions are met, the angle signal is sent to the evaluation device.

In the method according to the present invention, advantageously the samples are first sent directly and then, after a delay equal to the time corresponding to a quarter period of the current, to two FIR filters, forming four filter output quantities, the four filter output quantities are sent to an analyzer which generates at the output end a measured value corresponding to the amplitude of the current and another measured value corresponding to the differential angle between the measurement quantity and an older measurement quantity formed earlier by a quarter period of the current, and in the evaluation device the two measured values are used to produce an output signal that characterizes the sole occurrence of a decaying d.c. component as the measurement quantity after a current interruption.

In another embodiment of the method according to the present invention to solve the problem defined above, the digital samples are sent directly and after a delay equal to the time corresponding to a quarter period of the a.c. current to two FIR filters, forming two filter output quantities that are normal to each other; all the filter output quantities are sent to an analyzer that generates at the output one measured value corresponding to the amplitude of one measurement quantity and another measured value corresponding to the differential angle between the measurement quantity and an older measurement quantity formed earlier by a quarter period of the current, and an output signal is generated from the two measured values in an evaluation device when the measured values exceed preset threshold values.

The method according to the present invention can be used advantageously in a device for monitoring a circuit-breaker arranged in the conductor of the a.c. power transmission network if according to the present invention a logic circuit of the device also receives the tripping signal of the evaluation device in addition to the tripping signal of a protective device provided for the circuit-breaker and if a circuit-breaker failure signal is delivered by the logic circuit when an output signal is delivered whenever there is a tripping signal from the evaluation device. This use of the method according to the present invention leads, advantageously, to the possibility of differentiating an aperiodic d.c. component caused by the iron core remanence of the current transformer when there is a current interruption in the conductor from a current flowing continuously in the conductor. Therefore, with the delivery of a circuit-breaker failure signal, it is not necessary to wait a preset time (decay of the d.c. component) to obtain a reliable determination regarding a circuit-breaker failure. Such a circuit-breaker failure signal can thus be delivered quickly, whereupon other switches of the a.c. power transmission network can perform the shutdown for the faulted circuit-breaker.

However, the use of the method according to the present invention is not limited to the embodiments described in the present invention. The method according to the present invention can also be used advantageously even with a busbar protective device, where shutdown of a branch likewise causes a decaying d.c. component in the respective current transformer so there is an error in the formation of the summated current of the busbar protective device, because this increases the accuracy in error detection.

DETAILED DESCRIPTION

Figure 1:
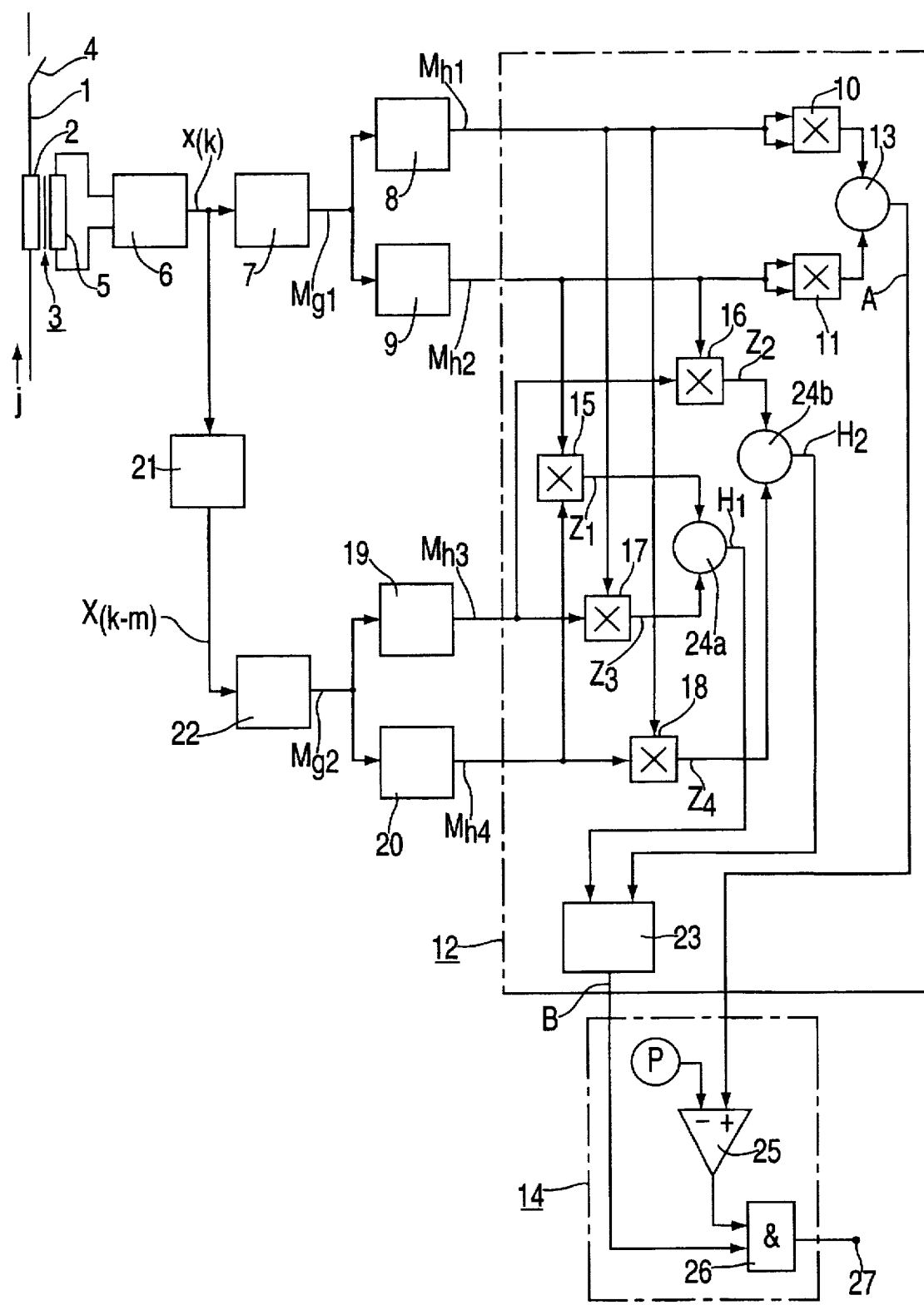
FIG. 1 shows a block schematic of an arrangement for carrying out a first embodiment of the method according to the present invention.

As FIG. 1 shows, a current J flows through a conductor 1 of an a.c. power supply network that is not shown any further. Conductor 1 includes primary winding 2 of a current transformer 3 and a circuit-breaker 4 (indicated only schematically). A sampling device 6 with an integrated analog-digital converter is connected to secondary winding 5 of current transformer 3.

When a current J in the form of a short-circuit current flows through conductor 1, as plotted over time in the left part of FIG. 2, the current flow through conductor 1 is interrupted when a protective device (not shown in FIG. 1) that is provided for circuit-breaker 4 has delivered a tripping signal and circuit-breaker 4 has subsequently responded. In the example shown here, circuit-breaker 4 responds at time $T_{AUS}$. However, because of the iron core remanence of current transformer 3, sampling device 6 continues even after time $T_{AUS}$ to pick up a secondary current that is an aperiodic decaying d.c. component that has the curve plotted over time t in the right part of FIG. 2. The decaying d.c. component is higher in absolute value than a threshold value $J_{Min}$ (also plotted in FIG. 2) even after the shutdown time $T_{AUS}$ of circuit-breaker 4.

Threshold value $J_{Min}$ serves to ascertain whether the current flow in conductor 1 has in fact been interrupted after a tripping signal of a protective device on circuit-breaker 4 has been delivered; if a current J higher in absolute value than threshold value $J_{Min}$ is detected, this is interpreted as a sign that circuit-breaker 4 has not disconnected properly. In this case, other circuit-breakers of the a.c. power supply network must assume the function of the defective circuit-breaker and isolate the defective line section from the network.

Figure 2:
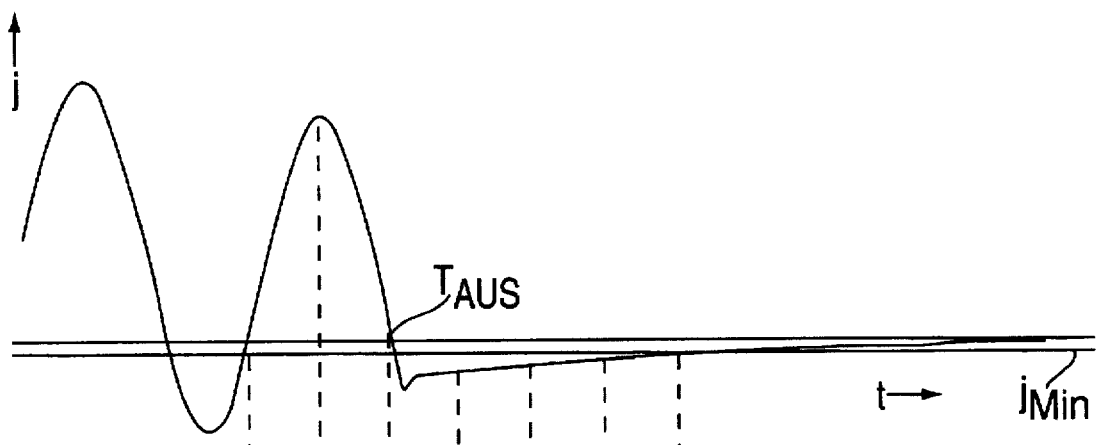
FIG. 2 shows a signal curve for the current in the conductor of an AC power transmission network.

If the secondary current of current transformer 3 is evaluated only with regard to its absolute value, failure of circuit-breaker 4 would be recorded incorrectly in the case illustrated in FIG. 2 because a current higher than the threshold $J_{Min}$ would be measured because of the decaying d.c. component. In the absence of other precautionary measures, adjacent circuit-breakers would then be activated unnecessarily. To prevent this in the past, one would have waited a certain period of time during which the d.c. component would normally subside, and then the absolute value of current J would be tested again with respect to the threshold value. However, this results in a relatively long waiting time.

This problem is remedied by using the method according to the present invention, by sending the digital samples $X_{(k)}$ obtained at the output of sampling device 6 first to a digital high-pass filter 7 where the decay of the d.c. component caused by current transformer 3 is limited, and offset quantities present in the digital samples $X_{(k)}$ are filtered out. Then a filtered measurement quantity $M_{g1}$ is obtained at the output of high-pass filter 7. This filtered measurement quantity $M_{g1}$ is sent to one FIR filter 8 and another FIR filter 9. The two FIR filters 8 and 9 are designed so that they generate auxiliary measurement quantities $M_{h1}$ and $M_{h2}$ normal to each other. The two FIR filters 8 and 9 are designed so that, with a sinusoidal input signal of sampling device 6 with a rated frequency of 50 Hz, for example, auxiliary measurement quantity $M_{h1}$ is phase-shifted by exactly 90° in comparison with auxiliary measurement quantity $M_{h2}$ of FIR filter 9 in an a.c. power supply network. In addition, measures are taken to assure that auxiliary measurement quantities $M_{h1}$ and $M_{h2}$ both have the same amplitude.

These auxiliary measurement quantities $M_{h1}$ and $M_{h2}$ are squared in multipliers 10 and 11 of analyzer 12 and then added up in an adder 13. Next an absolute value signal A is generated at the output of adder 13 and sent to an evaluation device 14.

Furthermore, one input of each of four multipliers 15, 16, 17 and 18 receives auxiliary measurement quantities $M_{h1}$ and $M_{h2}$ and the other input is connected to the outputs of two other FIR filters 19 and 20. These other FIR filters 19 and 20 are designed like FIR filters 8 and 9 and consequently when they receive an additional auxiliary measurement quantity $M_{g2}$ at their inputs they produce at their outputs additional auxiliary measurement quantities $M_{h3}$ and $M_{h4}$ that have the same amplitude but are phase shifted by 90° with respect to each other.

The additional auxiliary measurement quantity $M_{g2}$ is obtained from digital samples $X_{(k)}$ via time-delay element 21 and another high-pass filter 22. Time-delay element 21 is designed so that after a delay time of one quarter period of the current J, it delivers at its output the up-to-date samples a quarter period ago as the older digital samples $X_{(k-m)}$. This means that up-to-date digital samples $X_{(k)}$ are delivered by the first FIR filters 8 and 9, and at the same time digital samples $X_{(k-m)}$ that are older by a quarter period of current J are processed by the two other FIR filters 19 and 20.

The additional auxiliary measurement quantities $M_{h3}$ and $M_{h4}$ are sent to the other input of each of multipliers 15, 16, 17 and 18, as indicated above, shown in FIG. 1. Thus an intermediate quantity $Z_1$, which can be described by equation (1) below, is formed at the output of multiplier 15:

$$Z_1 = M_{h2} \times M_{h4} \tag{1}$$

$M_{h2}$ and $M_{h4}$ can be described by equations (2) and (3) as follows:

$$M_{h2} = G * X_{(k)} \tag{2}$$

$$M_{h4} = G * X_{(k-m)} \tag{3}$$

where * denotes a convolution operation and G denotes the transition function of FIR filter 9 and the additional FIR filter 20.

Similarly, intermediate quantity $Z_2$ at the output of multiplier 16, intermediate quantity $Z_3$ at the output of multiplier 17 and intermediate quantity $Z_4$ at the output of multiplier 18 can be described by the following equations (4) to (8):

$$Z_2 = M_{h2} \times M_{h3} \tag{4}$$

$$Z_3 = M_{h1} \times M_{h3} \tag{5}$$

and $$Z_4 = M_{h1} \times M_{h4} \tag{6}$$

where $$M_{h1} = F * X_{(k)} \tag{7}$$

and $$M_{h3} = F * X_{(k-m)} \tag{8}$$

where F denotes the transition function of FIR filter 8 and the additional FIR filter 19.

Intermediate quantities $Z_1$ and $Z_3$ are sent to another adder 24a. Similarly, intermediate quantities $Z_2$ and $Z_4$ are sent to an additional adder 24b. An auxiliary quantity $H_1$ is obtained at the output of the other adder 24a, while an additional auxiliary quantity $H_2$ is delivered at the output of the additional adder 24b. These auxiliary quantities $H_1$ and $H_2$ are sent to a threshold device 23 that delivers an angle signal B at its output.

The method shown in FIG. 1 is based on the following considerations. Due to the fact that auxiliary measurement quantities $M_{h1}$ and $M_{h2}$ are obtained by means of two FIR filters 8 and 9 and downstream multipliers 10 and 11 as well as adder 13, absolute value signal A is formed, which, for a sinusoidal curve of the current J in conductor 1 or in the secondary circuit of current transformer 3, represents an equal signal corresponding to the square of the amplitude of the current now flowing in the secondary circuit of current transformer 3. This can be illustrated by the following equation (9):

$$A^2 = \underbrace{[\hat{X}\sin(\omega_0 t + \phi_0)]^2}_{F*X} + \underbrace{[\hat{X}\sin(\omega_0 t + \phi_0 + 90°)]^2}_{G*X} \tag{9}$$

In this equation, the quantities G and F again represent the transition functions of FIR filters 8 and 9; $\omega_0$ denotes the angular frequency of the current J and $\phi_0$ denotes its phase angle. Equation (9) can also be expressed as follows:

$$A^2 = (G*X)^2 + (F*X)^2 \tag{10}$$

The differential angle measurement between digital samples $X_{(k)}$ and $X_{(k-m)}$ is based on complex division of these two signals. This can generally be expressed by the following equation (11):

$$\frac{X_{(k)} \cdot e^{j\phi_a}}{X_{(k-m)} \cdot e^{j\phi_b}} = \frac{X_{(k)}}{X_{(k-m)}} \cdot e^{j(\phi_a - \phi_b)} \tag{11}$$

When plotted in polar coordinates, it can be seen that the result of division of the two complex vectors has the differential angle of the two operands as the argument. Division is also performed in Cartesian coordinates because signals $X_{(k)}$ and $X_{(k-m)}$ are available only in Cartesian coordinates at the output of FIR filters 8, 9, 19 and 20. This can be expressed in general by equation (12):

$$\frac{a+jb}{c+jd} = \frac{(ac-bd) + j(bc-ad)}{\text{Denominator}} \tag{12}$$

Based on the present case, a in equation (12) is to be replaced by auxiliary measurement quantity $M_{h1}$, b is to be replaced by $M_{h2}$, c by $M_{h4}$ and d by $M_{h3}$. The numerator on the right-side fraction of equation (12) can then be written as follows:

$$(M_{h1} \times M_{h4} + M_{h2} \times M_{h3}) + j(M_{h2} \times M_{h4} - M_{h1} \times M_{h3}) \tag{13}$$

In equation (12) above, the denominator of the aforementioned fraction need not be calculated because the denominator is a real number and consequently does not contain any information with regard to the differential angle. The information about the differential angle is thus contained completely in the numerator of the given fraction. After summation (13), the individual products in the numerator of the fraction correspond to the individual intermediate quantities $Z_1$ to $Z_4$ defined above. Auxiliary quantities $H_1$ and $H_2$ thus represent a vector proportional to the quotient of signals $X_{(k)}$ and $X_{(k-m)}$. If it is now stipulated that this vector should have an angle of $>\pm 60°$ to be able to detect with certainty that a current is still flowing, despite the tripping signal sent to circuit-breaker 4, then this condition can be detected by measurement due to the fact that the real part of the vector must always be positive and the imaginary part of the vector must be smaller than tan 60°×real part of the vector.

Figure 3:
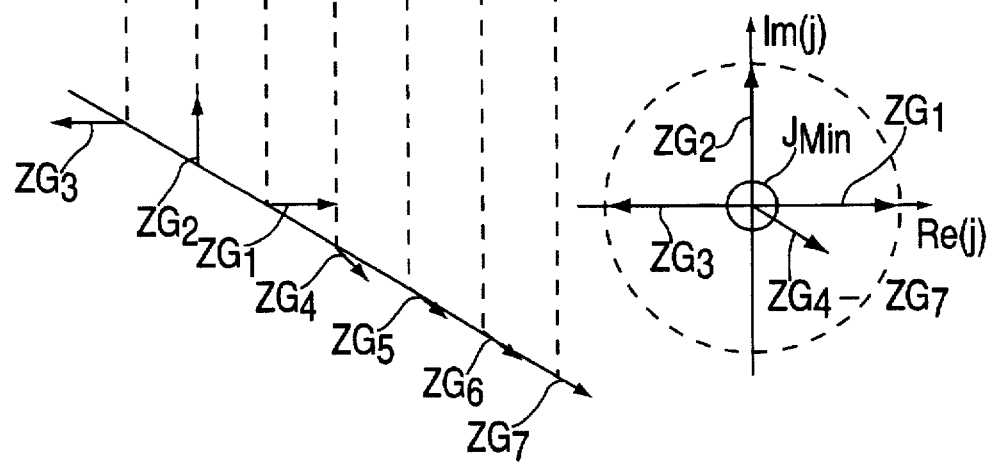
FIG. 3 shows a diagram of the complex vectors of the current and a vector diagram.

To illustrate this situation, reference is made to FIG. 3, the left part of which shows the position of the current vector measured at the time $T_{AUS}$ (see FIG. 2), at which point vector $ZG_1$ may assume the position shown here. In comparison with this vector $ZG_1$, vectors $ZG_2$ and $ZG_3$ have positions that are each offset by 90° at earlier times by a quarter period of current J. After the disconnect time $T_{AUS}$ when there is an interruption in current flow through conductor 1, vectors $ZG_4$ to $ZG_7$ are obtained in the following quarter periods because of the decaying d.c. component from current transformer 3. As shown by the right side of FIG. 3, these vectors are located in the fourth quadrant of this vector diagram. This means that the imaginary part of vectors $ZG_4$ to $ZG_7$ essentially does not change position when a decaying d.c. component is detected. This is evaluated in threshold element 23.

In downstream evaluation device 14, absolute value signal A is checked in comparator 25 to determine whether a preset threshold value P is exceeded. If this is the case, a signal is delivered to logic circuit 26 configured as an AND element. Angle signal B is supplied by threshold element 23 at another input of logic circuit 26 when the real part of the vector is positive and the imaginary part of the vector is ≦tan 60°×real part, as explained above in detail. This means that no decaying d.c. component has been detected, so then a circuit-breaker failure signal is generated at output 27 of logic circuit 26.

Figure 4:
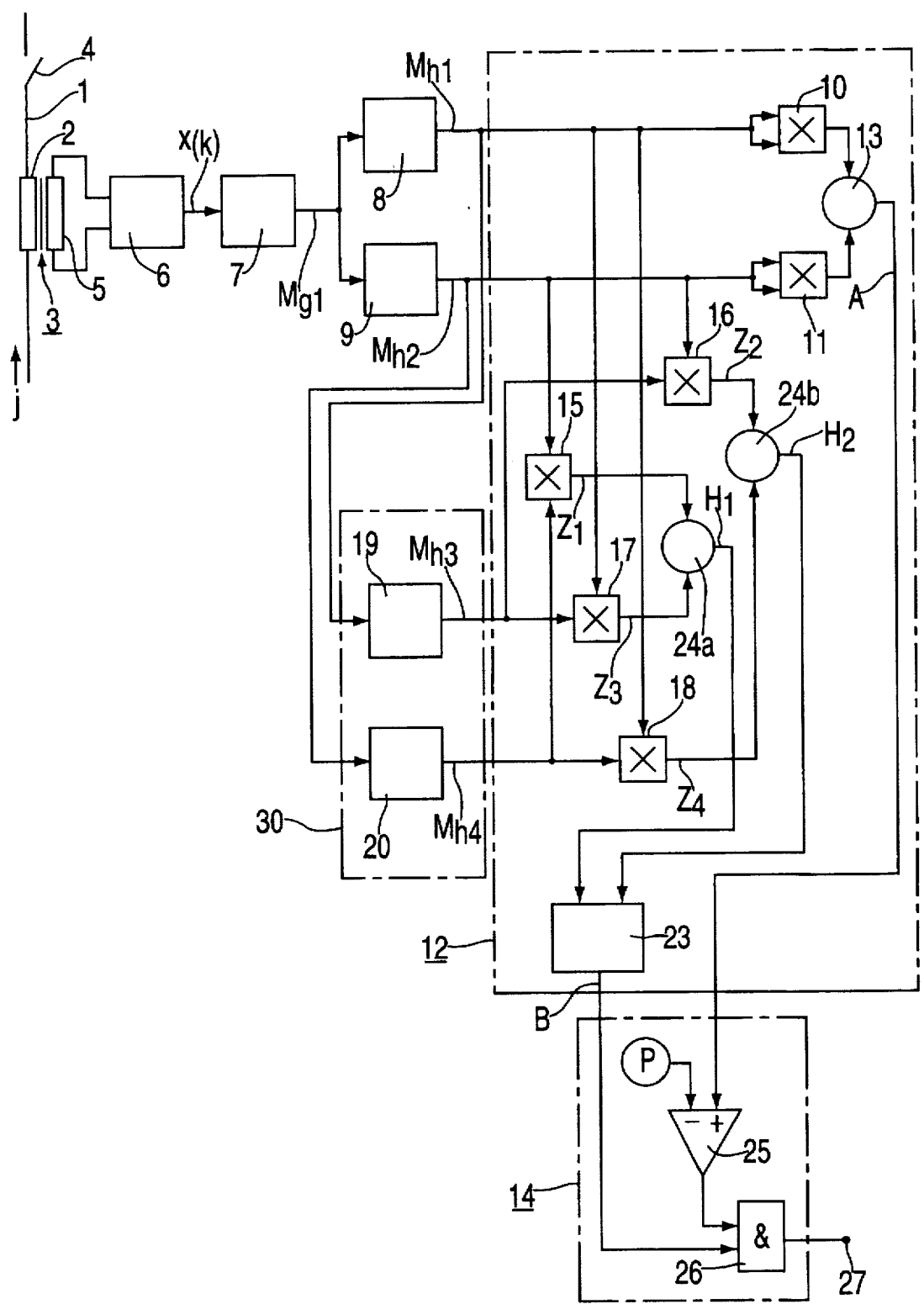
FIG. 4 shows a block schematic of an arrangement for implementing a second embodiment of the method according to the present invention.

In the embodiment according to the present invention shown in FIG. 4, components corresponding to the embodiment according to FIG. 1 are labeled with the same numbers. It can be seen that in comparison with the embodiment according to FIG. 1, the two additional FIR filters are omitted here. Instead, the two additional auxiliary measurement quantities $M_{h3}$ and $M_{h4}$ are generated by means of a time-delay circuit 30 that assures a delay of the output signals (auxiliary measurement quantities $M_{h1}$ and $M_{h2}$) of FIR filters 8 and 9 by a time corresponding to a quarter period of current J. Otherwise the method according to FIG. 4 operates in the same way as described in detail in conjunction with FIG. 1.

In the embodiment according to the present invention shown in FIG. 5, the input part is again designed as in the embodiment according to FIGS. 1 and 4, so the same numbers are also used in FIG. 5 as in FIGS. 1 and 4 in this regard.

In deviation from the methods described above and illustrated in FIGS. 1 and 4, digital samples $X_{(k)}$ here are sent directly to one FIR filter 40 and are also sent via a time-delay element 41 to another FIR filter 42. This assures that FIR filter 40 receives the up-to-date samples $X_{(k)}$ and FIR filter 42 receives $X_{(k-m)}$ samples that are older by a quarter period of current J. The delay produced by circuit 41 is therefore selected to correspond to a quarter period of current J in conductor 1.

Quantities $M_1$, $M_2$, $M_3$ and $M_4$ that are obtained at the output of FIR filters 40 and 42 can be described as indicated in the literature reference "IEEE Transactions on Power Delivery," vol. 7, no. 2, Apr. 1992, page 621, if FIR filters 40 and 42 are designed as indicated on the same page of said reference. Then one derived quantity $M_{a1}$ can be generated at one output 44 by means of a downstream computation circuit 43, and another derived quantity $M_{a2}$ can be generated at another output 45, where the first derived quantity $M_{a1}$ corresponds to the absolute value of current J and the other derived quantity $M_{g2}$ corresponds to the differential angle between digital samples $X_{(k)}$ and $X_{(k-m)}$. Then by means of a downstream threshold device 46 it is possible to determine whether the differential angle is <60° and whether the amplitude has exceeded a preset threshold. In this case, a circuit-breaker failure signal is then sent to an output 47.

Figure 5:
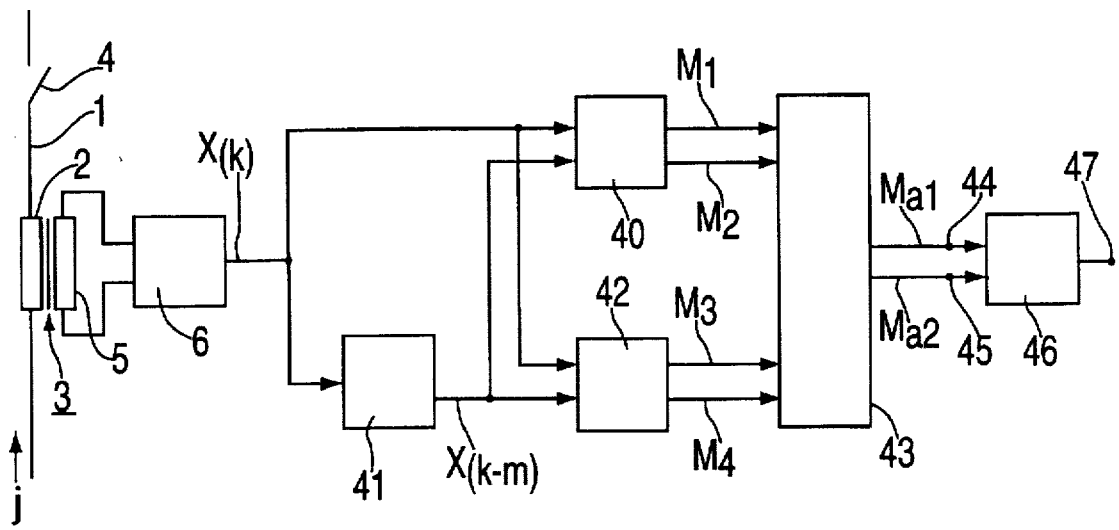
FIG. 5 shows a block schematic of an arrangement for implementing a third embodiment of the method according to the present invention.
Figure 6:
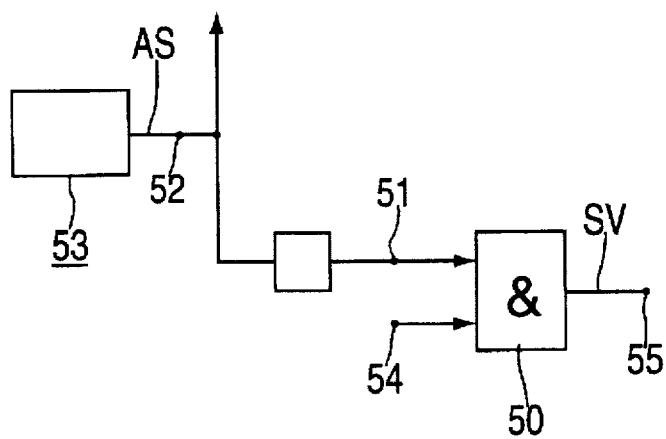
FIG. 6 shows a part of a device for monitoring a circuit-breaker, according to the present invention.

FIG. 6 shows a logic circuit 50 configured as art AND element of a device (not shown otherwise) for monitoring circuit-breaker 4 shown in FIGS. 1, 4 and 5 for circuit-breaker failure. At its input 51 logic circuit 50 is connected via a time-delay circuit whose delay must be just slightly longer than the disconnect time of circuit-breaker 4 to an output 52 of a protective device 53 for circuit-breaker 4, and when a tripping signal AS for circuit-breaker 4 occurs, logic circuit 50 also receives this signal with a time delay. In addition, another input 54 of logic circuit 50 is connected to output 47 of evaluation device 46; if the output signal of evaluation device 14 or 46 occurs simultaneously with the delayed tripping signal AS at the inputs of logic circuit 50, circuit-breaker failure signal SV appears at output 55.

What is claimed is:

1. A method of measuring an AC current in a conductor of an AC power transmission network, the method comprising the steps of:

obtaining a measurement quantity proportional to the AC current using a current transformer;

generating digital samples from the measurement quantity using a sampling device, the digital samples including first digital samples and second digital samples, the second digital samples being generated before the first digital samples by a quarter period of the AC current;

forming first and second initial auxiliary measurement quantities as a function of the first digital samples using first and second FIR filters, the first and second initial auxiliary measurement quantities being normal to each other;

forming third and fourth initial auxiliary measurement quantities as a function of the second digital samples, the third and fourth initial auxiliary measurement quantities being normal to each other;

generating an absolute value signal as a function of an amplitude of the measurement quantity;

generating an angle signal by complex division of a first vector formed from the first digital samples and a second vector formed from the second digital samples, the complex division being performed using the first, second, third and fourth initial auxiliary measurement quantities; and generating an evaluation output signal as a function of the absolute value signal and the angle signal when the absolute value signal and the angle signal exceed respective predetermined threshold values.

2. The method according to claim 1, further comprising the step of:

forming a first filtered measurement quantity as a function of the first digital samples using a first digital high-pass filter, wherein the first and second initial auxiliary measurement quantities are formed as a function of the first filtered measurement quantity using the first and second FIR filters.

3. The method according to claim 1, wherein the third and fourth initial auxiliary measurement quantities are formed concurrently with the first and second initial auxiliary measurement quantities by providing the second digital samples to third and fourth FIR filters.

4. The method according to claim 3, further comprising the step of:

forming a second filtered measurement quantity as a function of the second digital samples using a second high-pass filter, wherein the third and fourth initial auxiliary measurement quantities are formed as a function of the second filtered measurement quantity using the third and fourth FIR filters.

5. The method according to claim 1 wherein the third and fourth initial auxiliary measurement quantities are formed using a time-delay circuit having a time-delay input and a time-delay output, the time-delay circuit receiving the first and second initial auxiliary measurement quantities at the time-delay input and providing the third and fourth initial auxiliary measurement quantities at the time-delay output after the earlier quarter period of the AC current, wherein the time-delay circuit produces a delay corresponding to a quarter period of the AC current.

6. The method according claim 1, further comprising the steps of:

multiplying each one of the first and second initial auxiliary measurement quantities by each one of the third and fourth initial auxiliary measurement quantities to form at least four intermediate quantities;

adding two of the at least four intermediate quantities to form first and second combined auxiliary quantities, wherein the angle signal is provided to the evaluation circuit when the first combined auxiliary quantity has a predetermined sign and when the second combined auxiliary quantity exceeds one of the respective preselected threshold values.

7. The method according to claim 1, wherein each of the first and second initial auxiliary measurement quantities are squared and summed to form the absolute value signal.

8. A method of measuring an AC current in a conductor of an AC power transmission network, the method comprising the steps of:

obtaining a measurement quantity proportional to the AC current using a current transformer;

generating digital samples as a function of the measurement quantity using a sampling device;

providing the digital samples to first and second FIR filters to form first and second filter output quantities which are normal to each other;

providing the digital samples to a time delay device which generates delayed digital samples by delaying the digital samples by a quarter period of the AC current;

providing the delayed digital samples to the first and second FIR filters to form third and fourth filter output quantities which are normal to each other;

providing the first, second, third and fourth filter output quantities to an analysis device for generating first and second measured values, the first measured value corresponding to an amplitude of the AC current and the second measured value corresponding to a differential angle between the measurement quantity corresponding to the digital samples and the measurement quantity corresponding to the delayed digital samples; and generating an output signal when the first and second measured values exceed predetermined threshold values.

* * * * *